(12) United States Patent
Nagashima et al.

(10) Patent No.: US 6,610,923 B1
(45) Date of Patent: Aug. 26, 2003

(54) MULTI-CHIP MODULE UTILIZING LEADFRAME

(75) Inventors: Mitsunori Nagashima, Kyoto (JP); Kohshi Nishimura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/704,801

(22) Filed: Nov. 3, 2000

(30) Foreign Application Priority Data

Nov. 5, 1999 (JP) .......................................... 11-315911

(51) Int. Cl.[7] .................................................. H05K 5/06
(52) U.S. Cl. ...................... 174/52.2; 174/52.4; 257/676; 257/692; 257/693; 257/724
(58) Field of Search ............................... 174/52.2, 52.4; 257/723, 724, 725, 666, 676, 692, 693

(56) References Cited

U.S. PATENT DOCUMENTS

| | | | | |
|---|---|---|---|---|
| 5,394,008 A | * | 2/1995 | Ito et al. ...................... | 257/666 |
| 5,399,905 A | * | 3/1995 | Honda et al. ................ | 257/666 |
| 5,459,350 A | * | 10/1995 | Date et al. ................... | 257/666 |
| 5,869,898 A | * | 2/1999 | Sato ............................ | 257/728 |
| 6,002,166 A | * | 12/1999 | Noda et al. .................. | 257/666 |
| 6,249,024 B1 | * | 6/2001 | Mangtani .................... | 257/341 |

FOREIGN PATENT DOCUMENTS

| | | | | |
|---|---|---|---|---|
| JP | 05-029539 | 2/1993 | .......... | H01L/25/07 |
| JP | 05-198735 | 8/1993 | .......... | H01L/25/04 |

* cited by examiner

*Primary Examiner*—Hung V. Ngo
(74) *Attorney, Agent, or Firm*—Michael D. Bednarek; Shaw Pittman LLP

(57) ABSTRACT

A multi-chip module includes metal frame segments including a plurality of die-bonding pads and a plurality of terminals, a plurality of electronic components mounted on the die-bonding pads in electrical connection to the terminals, and a resin package for enclosing the electronic components and the metal frame segments with each of the terminals partially projecting outwardly from the resin package. Selected ones of the electronic components are electrically connected to each other via the metal frame segments and wires within the resin package.

5 Claims, 9 Drawing Sheets

MULTI-CHIP MODULE UTILIZING LEADFRAME

BACKGROUND OF THE INVENTION

1. Field of the Invention:

The present invention relates to a multi-chip module comprising a plurality of electronic components (e.g. IC chips, resistors and capacitors) which are collectively enclosed in a resin package.

2. Description of the Related Art

A typical prior-art multi-chip module has the structure as shown in FIG. 7. The illustrated multichip module includes a substrate 90 made of epoxy resin for example. The substrate 90 is formed with a predetermined wiring pattern 92. A plurality of electronic components 91 are mounted on the substrate 90. Each of the electronic components 91 has terminals which are electrically connected, via a plurality of wires W, to respective portions of the wiring pattern 92 on the substrate 90. Terminal made of metal are soldered onto the wiring patter 92 The electronic components 91, the wires W and their bonding portions are coated with resin (not shown applied and melt thereon for insulation and protection.

According to the structure shown in FIG. 7, however, the process for making the multi-chip module is complicated because it requires the successive steps of forming the wiring pattern 92 on the substrate 90 using a metal film, and mounting the terminals 93 on the substrate 90 into conduction with the wiring pattern 92.

To solve the problem described above, JP-U-A-5-15449 and JP-A-5-29539 disclose another type of multi-chip module, which is made utilizing a leadframe as shown in FIG. 8. Specifically, the leadframe designated generally by reference numeral 94 includes a plurality of die-bonding pads 95 and a plurality of leads 96. A plurality of electronic components 91 are mounted on the die-bonding pads 95, respectively. The lead terminals 96 correspond to the terminals 91a of the electronic components 91. Each terminal 91a of the electronic components 91 is electrically connected to a respective of the lead terminals 96 via a wire W.

As shown in FIG. 9, a resin package 97 is molded to the electronic components 91 together with part of the lead terminals 96, and the lead terminals 96 are cut off the leadframe 94 to provide a multi-chip module. In the multi-chip module thus provided, the lead terminals 96 are insulated from each other and partially protrude outwardly from the resin package 97. This type of multi-chip module can be manufactured more easily than the multi-chip module of the type shown in FIG. 7

In this type of multi-chip module, however, the lead terminals 96 are provided only for electrically connecting the terminals 91a of each electronic component 91 to another member outside the resin package 97. Therefore, although the plurality of electronic components 91 are collectively resin-packaged in the multi-chip module, the electronic components 91 are not electrically connected to each other inside the resin package 97. Therefore, it is impossible to complete a desired electric circuit solely by the multi-chip module even if all electronic components necessary for completing the electric circuit are fully built in the multi-chip module. In other words, any electronic component of the multi-chip module can be electrically connected to any other component of the same module only via a wiring pattern of an external circuit board to which the module is mounted or connected. Such a need not only is inconvenient but also leads to a cost increase.

SUMMARY OF THE INVENTION

It is therefore an object of the present invention to provide a multi-chip module which is capable of completing an electric circuit without utilizing an external element or elements such as a printed circuit board.

In accordance with a first aspect of the present invention, there is provided a multi-chip module comprising metal frame segments including a plurality of die-bonding pads and a plurality of terminals, a plurality of electronic components mounted on the die-bonding pads in electrical connection to the terminals, and a resin package for enclosing the electronic components and the metal frame segments with each of the terminals partially projecting outwardly from the resin package. Selected ones of the electronic components are electrically connected to each other via the metal frame segments and wires within the resin package.

With the structure described above, selected ones or all of the electronic components are electrically connected to each other via the metal frame segments and the wires within the resin package, so that a desired electric circuit can be completed without relying on an external element or elements. Further, since the metal frame segments come from a metal frame, it is unnecessary to use an insulating substrate on which a conductor layer needs to be formed and etched to provide a wiring pattern as required for completing the intended circuitry.

Preferably, the metal frame segments may further include at least one intermediary element separate from the die-bonding pads and the terminals for electrically connecting at least one of the electronic components to at least another of the electronic components.

Preferably, the intermediary element may be electrically connected to selected ones of the electronic components via wires.

Preferably, at least one of the electronic components may be mounted to bridge between one of the terminals and one of the die-bonding pads.

Preferably, at least one of the electronic components may be mounted to bridge between selected two of the die-bonding pads.

Preferably, at least two of the electronic components may be bonded on a common one of the die-bonding pads.

In a preferred embodiment, the electronic components together with the metal frame segments constitute a protective circuit for protecting a rechargeable battery. In this case, one of the terminals may preferably have two electrode portions projecting outwardly from the resin package, whereas each of the other terminals may have a single electrode portion-projecting outwardly from the resin package.

Other features and advantages of the present invention will become clearer from the detailed description given below with reference to the accompanying drawings.

DETAILED DESCRIPTION OF THE PREFERRED EMBODIMENTS

A preferred embodiment of the present invention will be described below in detail with reference to FIGS. 1~6 of the accompanying drawings.

Figure 1:
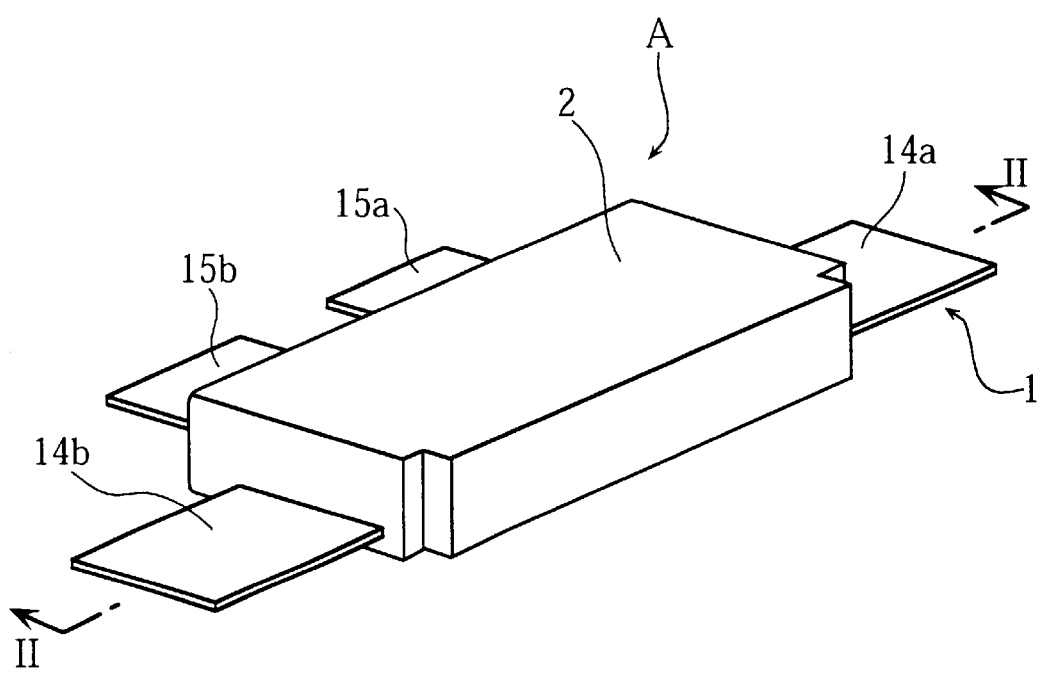
FIG. 1 is a perspective view showing an example of multi-chip module according to the present invention.
Figure 2:
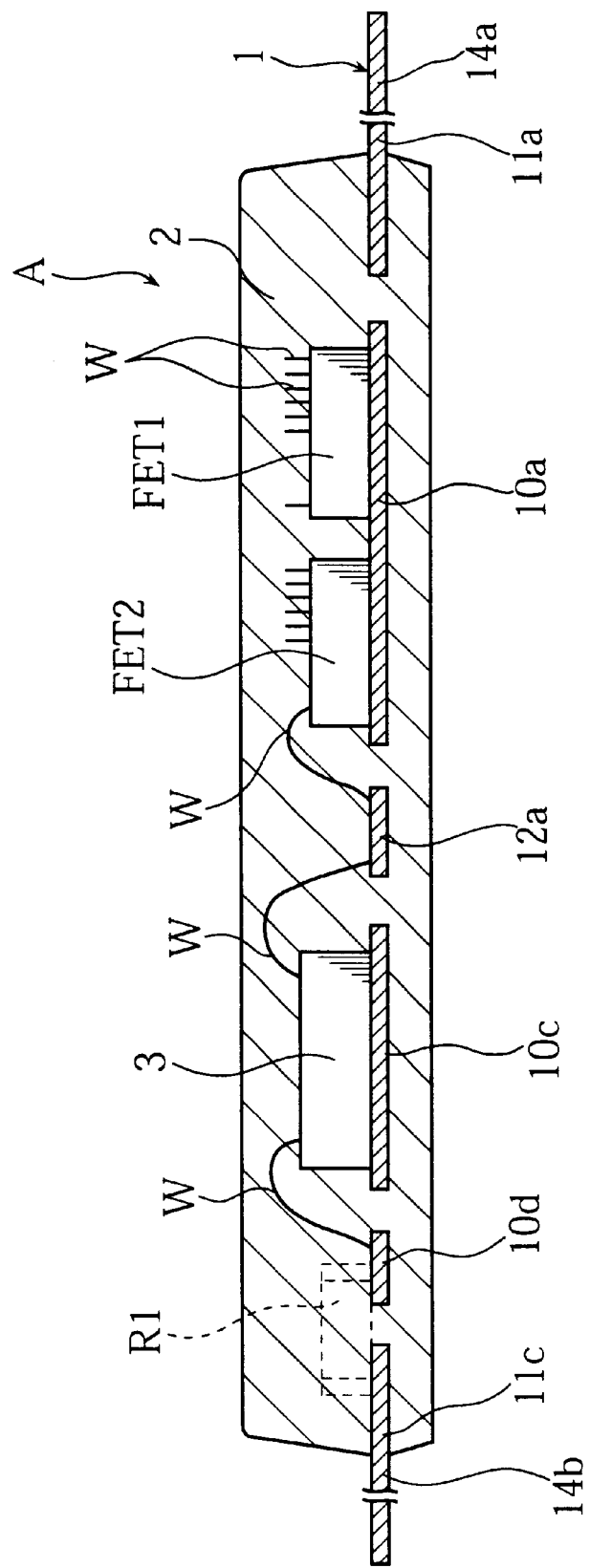
FIG. 2 is a sectional view taken along lines II—II in FIG. 1.
Figure 3:
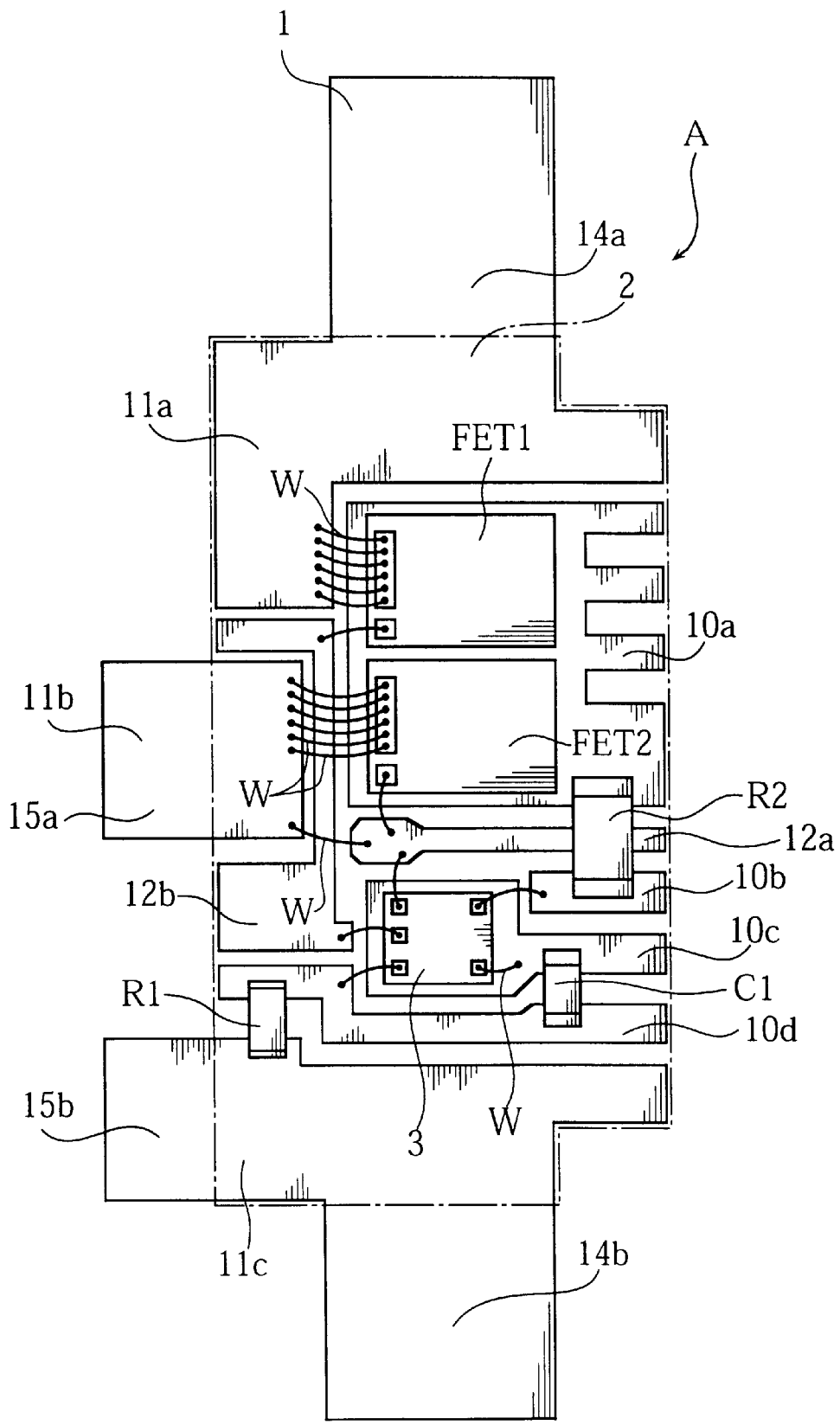
FIG. 3 is a plan view of the multi-chip module shown in FIG. 1 with a resin package removed.

FIGS. 1 through 3 illustrate an example of multi-chip module embodying the present invention. The illustrated multi-chip module A in this embodiment may be so designed to work as a protective circuit for protecting a rechargeable battery (or battery pack) for a mobile phone for example. The multi-chip module A comprises a plurality of metal frame segments represented collectively by reference numeral 1. The module A also comprises a resin package 2 and a plurality of electronic components which are sealingly enclosed in the resin package 2 and which will be described later.

The term "metal frame segments" represents that they are previously integral portions of a single metal frame but cut off from the metal frame to be separate from each other, as described hereinafter with reference to FIGS. 5 and 6. Each of the metal frame segments 1 (namely the metal frame as a whole) may be made of a metal such as copper for example. As shown in FIG. 3, the metal frame segments 1 include a first through a fourth chip-supporting segments 10a~10d, a first through a third terminals 11a~11c, and a first and a second intermediary elements 12a, 12b. The first and the third chip-supporting segments 10a, 10c are die-bonding pads.

Each of the electronic components is in the form of a chip. Specifically, the electronic components include two chip field-effect transistors FET1, FET2, two chip resistors R1, R2, a chip capacitor C1 and an chip IC 3. The field-effect transistors FET1, FET2 are mounted on the chip-supporting segment 10a. The resistor element R1 is mounted to bridge between the fourth chip-supporting segment 10d and the third terminal 11c. The resistor element R2 is mounted to bridge between the first chip-supporting segment 10a and the second chip-supporting segment 10b across the first intermediary element 12a. The capacitor element C1 is mounted to bridge between the third chip-supporting segment 10c and the fourth chip-supporting segment 10d. The IC chip 3 is mounted on the third chip-supporting segment 10c.

The above-described electronic components are electrically connected to each other via wires W and the two intermediary elements 12a, 12b as well as via portions of the chip-supporting segments 10a~10d not used for die-bonding. More specifically, each of the field-effect transistors FET1, FET2 is provided, on the reverse surface thereof, with terminals (not shown) which are electrically connected to the first chip-supporting segment 10a. The obverse surface of the field-effect transistor FET1 is provided with terminals electrically connected to the first terminal 11a and the second intermediary element 12b via selected ones of the wires W. The obverse surface of the field-effect transistor FET2 is provided with terminals electrically connected to the second terminal 11b and the first intermediary element 12a via other selected ones of the wires W. The second terminal 11b is connected to the first intermediary element 12a via one of the wires W. The resistor element R2 is elongated and provided, on the reverse surface thereof, with a pair of terminals (not shown) arranged at longitudinally opposite ends thereof. The paired terminals of the resistor element R2 are electrically connected to the first and the second chip-supporting segments 10a, 10b, respectively. With such a structure, the resistor element R2 provides electrical connection between the first chip-supporting segment 10a and the second chip-supporting segment lob. The IC chip 3 is provided, on the obverse surface thereof, with a plurality of terminal pads which are connected, via the remaining ones of the wires W, to the first and the second intermediary elements 12a, 12b and the second through the fourth chip-supporting segments 10b~10d, respectively. The capacitor element C1 is elongated and provided, on the reverse surface thereof, with a pair of terminals (not shown) arranged at longitudinally opposite ends thereof. The paired terminals of the capacitor element C1 are electrically connected to the third and the fourth chip-supporting segments 10c, 10d, respectively. The resistor element R1 is also elongated and provided, on the reverse surface thereof, with a pair of terminals (not shown) arranged at longitudinally opposite ends thereof. The paired terminals of the resistor element R1 are electrically connected to the fourth chip-supporting segment 10d and the third terminal 11c, respectively.

The resin package 2 indicated by phantom lines in FIG. 3 may be formed of epoxy resin for example. The resin package 2 encloses the above-described electronic components, the wires W and selected portions of the metal frame segments 1. One portion 14a of the first terminal 11a projects outwardly from the resin package 2. Similarly, one portion 15a of the second terminal 11b and two portions 14b, 15b of the third terminal 11c project outwardly from the resin package 2. The projecting end 14a of the first terminal 11a and the projecting end 14b of the third terminal 11c serve as a pair of electrodes for electrical connection to the electrodes of the rechargeable battery (or battery pack). The projecting end 15a of the second terminal 11b and the projecting end 15b of the third terminal 11c serve as a pair of electrodes for electrical connection to a charger which supplies electricity to the multi-chip module A.

Figure 4:
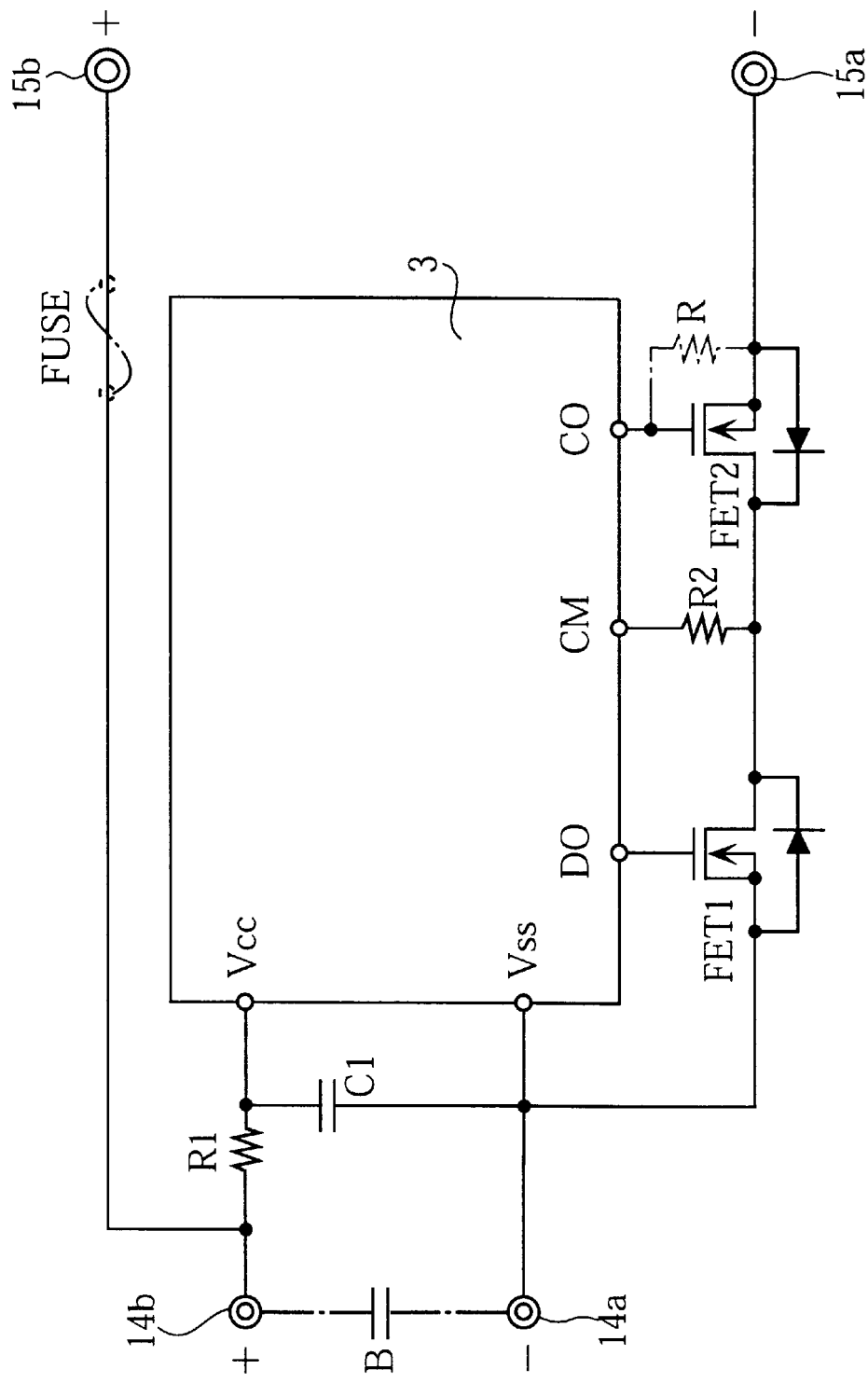
FIG. 4 illustrates an example of electric circuit which is equivalent to the electric circuit built in the multi-chip module.

FIG. 4 illustrates an equivalent circuit of the battery protective circuit built in the multi-chip module A. The battery protective circuit (IC chip 3) includes terminals Vcc, Vss connected to the paired electrodes 14a, 14b for connection to a battery B (or battery pack), terminals DO, CO respectively connected to the field-effect transistors FET1, FET2, and a terminal CM connected to the resistor element R2. Each of the field-effect transistors FET1, FET2 has a built-in diode for preventing reverse current.

In the battery protective circuit shown in FIG. 4, when the voltage of the battery B connected to the paired electrodes 14a, 14b rises to a predetermined level, current flow from the electrodes 15a, 15b to the electrodes 14a, 14b is stopped to prevent overcharging of the battery. Further, if the electrodes 15a, 15b are erroneously connected to the charger with opposite polarity, current flow to the electrodes 14a, 14b is also prevented. The resistor element R2 functions to protect the IC chip 3 when the charger is oppositely connected to the electrodes 15a, 15b. Preferably, the protective circuit built in the multi-chip module A may additionally includes a fuse and a resistor R, as indicated by phantom lines in FIG. 4. The fuse functions to prevent an overcurrent to the battery B from outside. The resistor R is a pull-down resistor which turns off the field-effect transistor FET2 for protecting the IC chip 3 when the charger is oppositely connected.

Figure 5:
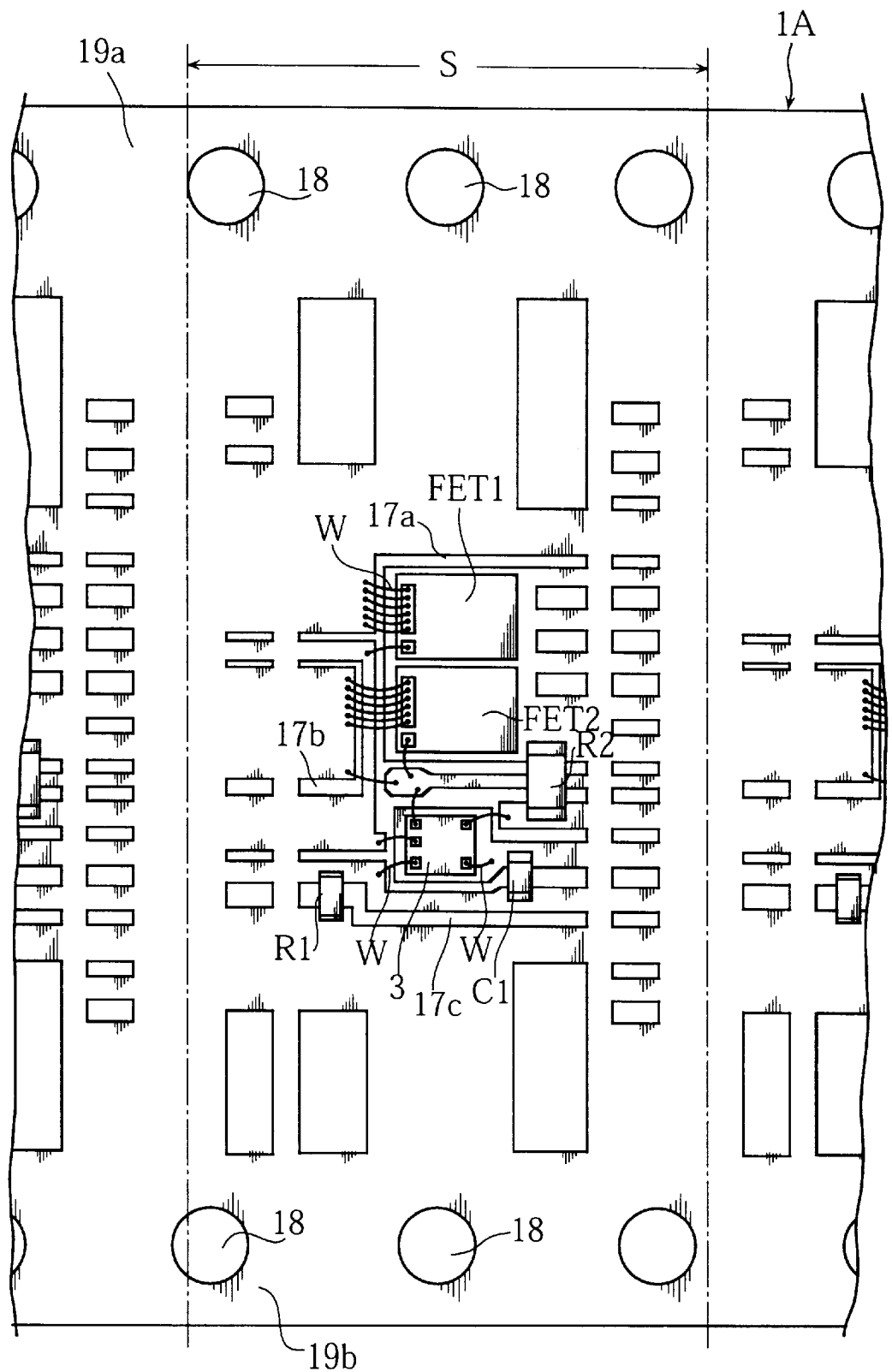
FIGS. 5 and 6 illustrate successive steps of making the multi-chip module in accordance with the present invention.

The multi-chip module A having the above-described structure may be manufactured utilizing a metal frame 1A in the following manner, as shown in FIGS. 5 and The metal frame 1A may be formed by punching an elongate thin metal sheet made of copper for example. The metal frame 1A has longitudinal edges 19a, 19b each of which is formed with a plurality of feed holes 18 at a constant pitch. In each of unit regions indicated by reference sign S, the metal frame 1A includes portions which are later formed into the above-described metal frame segments 1 (i.e., the first through the fourth chip-supporting segments 10a~10d, the first through the third terminals 11a~11c, the first and the second intermediary elements 12a, 12b). The metal frame 1A is formed with slits 17a~17c for separating these portions from each other. Further, the metal frame 1A is appropriately formed with holes which are different in size and configuration from the slits 17a~17c.

In manufacture, a set of electronic components including field-effect transistors FET1, FET2, resistor elements R1, R2, a capacitor element C1 and an IC chip 3 are mounted on each unit region S of the metal frame 1A, and a plurality of wires W are bonded at appropriate portions, as shown in FIG. 5. Such chip-bonding and wire-bonding in the unit region S are repeated longitudinally of the metal frame 1A.

Figure 6:
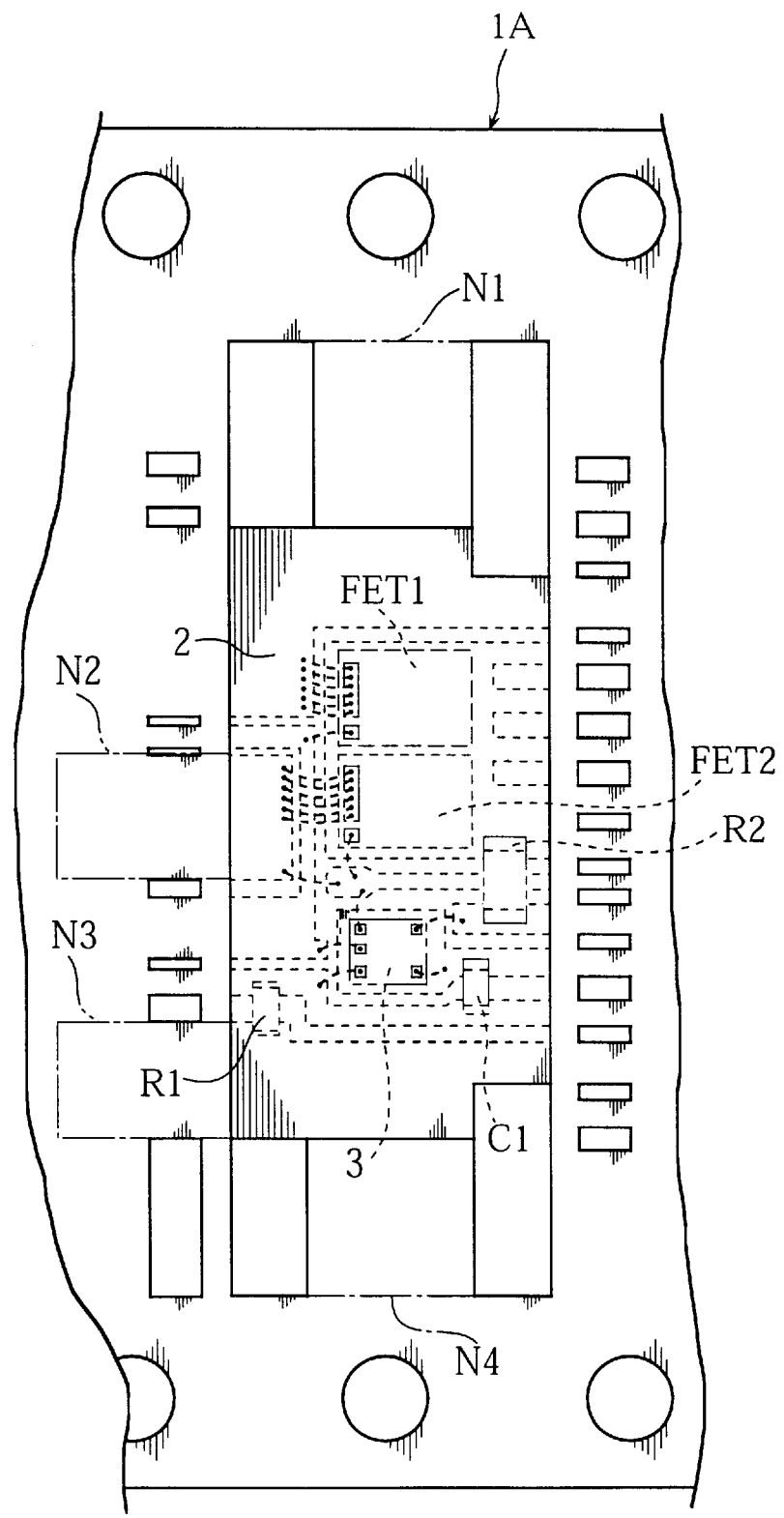
Figure 7:
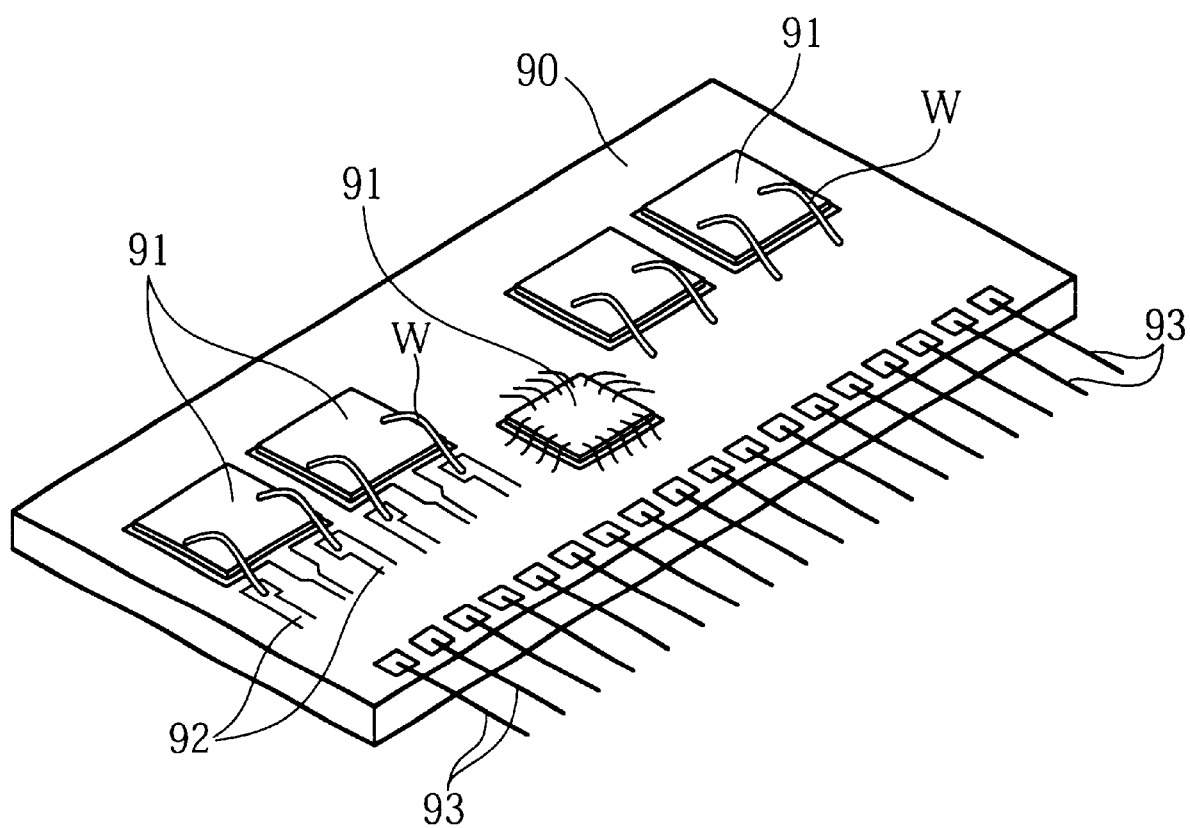
FIG. 7 is a perspective view showing an example of prior art multi-chip module.
Figure 8:
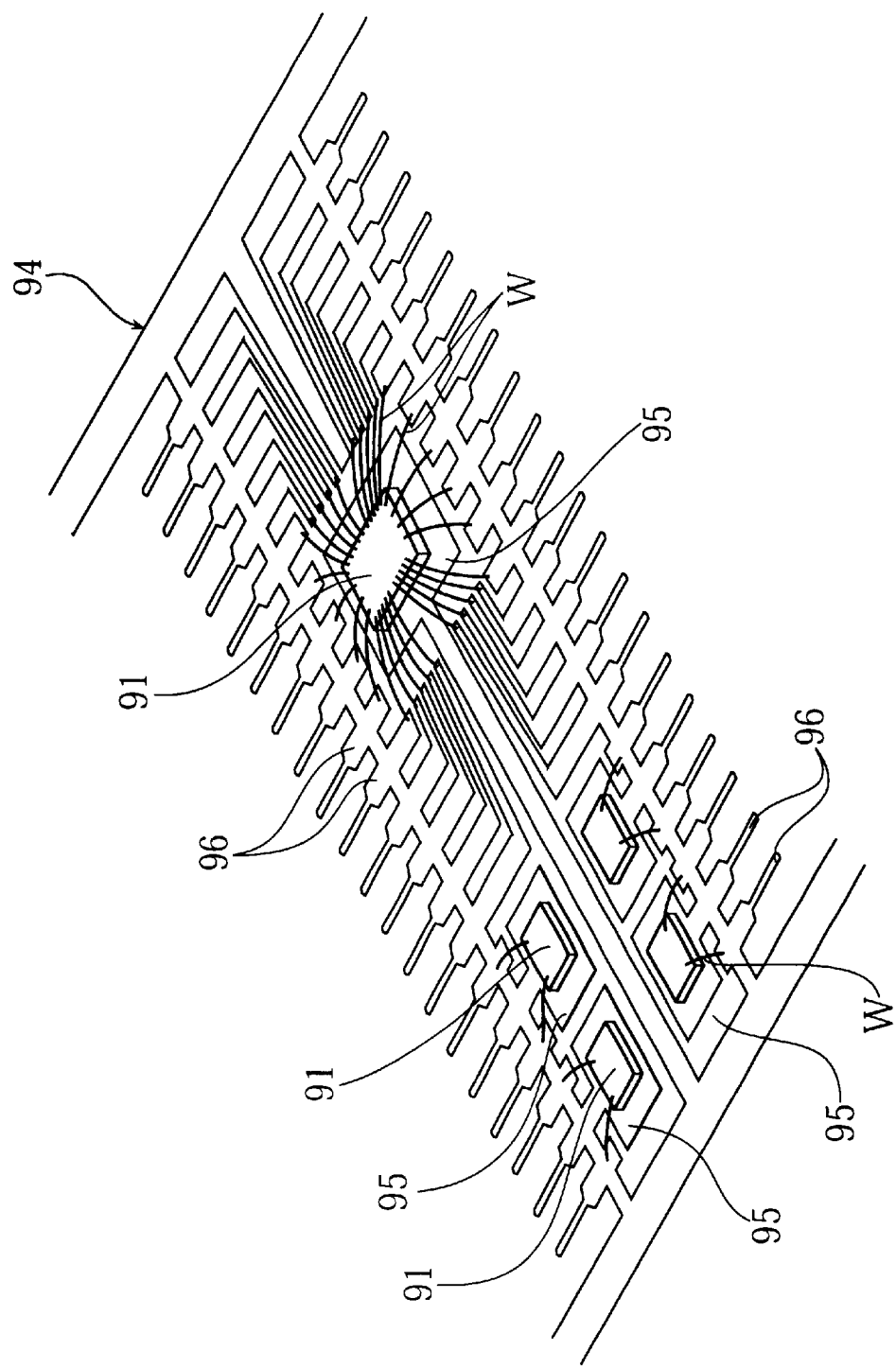
FIG. 8 is a perspective view showing another example of prior art multi-chip module.
Figure 9:
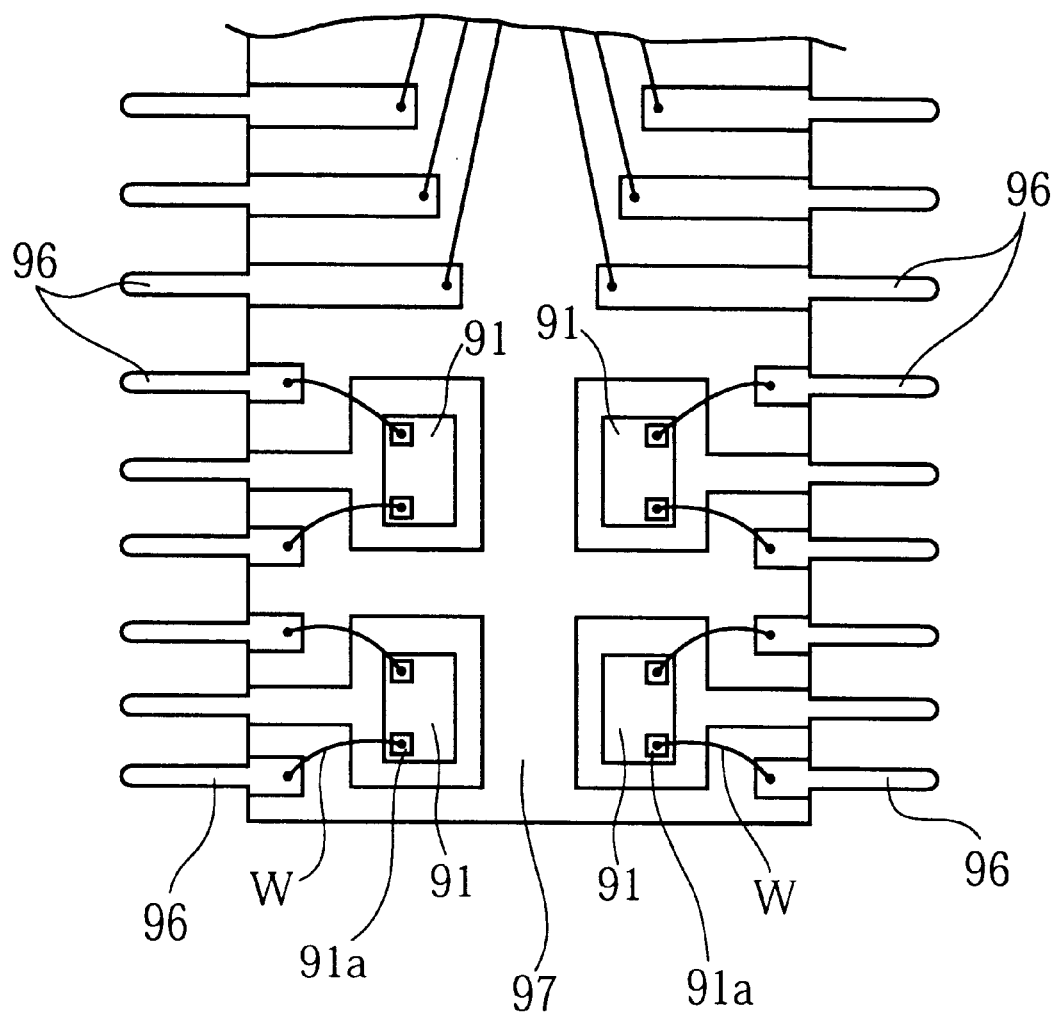
FIG. 9 is a plan view of the prior art multi-chip module shown in FIG. 8.

After the chip-bonding and the wire-bonding, a resin package 2 is formed on each unit region S of the metal frame 1A, as shown in FIG. 6. The resin package 2 may be formed by transfer molding for example.

Finally, the metal frame 1A is cut generally along the periphery of the resin package 2. However, at portions where the electrodes 14a, 14b, 15a, 15b (see FIG. 3) need to project from the resin package 2, the metal frame 1A is cut along the phantom lines N1~N4 shown in FIG. 6. As a result of such a cutting operation, a multi-chip module A having the above-described structure is obtained. The electrodes 14a, 14b, 15a, 15b may be later bent as required.

In use of the multi-chip module A, the electrodes 14a, 14b are brought into contact with the electrodes of the battery B (see FIG. 4), whereas the electrodes 15a, 15b are brought into contact with the electrodes of the non-illustrated charger. Since the multi-chip module A constitutes a complete protective circuit for a battery in a self-contained manner, protection of the battery B during the charge is performed by the multi-chip module alone, i.e., without the need for using any external circuit.

The multi-chip module A according to the present invention can be easily made by the above-described method which is similar to the method of making a prior art multi-chip module utilizing a leadframe. In so doing, there is no need to use an insulating substrate on which a conductor layer is formed and etched to provide a circuit pattern. Further, since the manufacture of a semiconductor device using a leadframe is conventional, any manufacturer having the equipment for that purpose can make the multi-chip module A according to the present invention at a low cost.

The specific structure of the multi-chip module is not limited to that described above, and may be modified in various ways.

In the embodiment described above, the multi-chip module serves as a protective circuit for a rechargeable battery is described. However, the present invention is not limited thereto, and is applicable for constituting various electric circuits. Therefore, the kind and number of electronic components to be built in the multi-chip module are not limitative. Further, all the electronic components enclosed in a resin package need not necessarily be electrically connected to each other.

The present invention being thus described, it is obvious that the same may be varied in many ways. Such modifications should not be regarded as a departure from the spirit and scope of the present invention, and all such modifications as would be obvious to those skilled in the art from the above description are intended to be included in the scope of the following claims.

What is claimed is:

1. A multi-chip module comprising:
   metal frame segments including a plurality of chip supporting segments and a first to a third terminals, the metal frame segments being separate from each other;
   a plurality of electronic components mounted on the chip supporting segments in electrical connection to the terminals; and
   a resin package for enclosing the electronic components and the metal frame segments, each of the terminals partially projecting outwardly from the resin package, the resin package including a first side surface, a second side surface opposite to the first side surface, and a third side surface between the first and the second surfaces;
   wherein selected ones of the electronic components are electrically connected to each other via the metal frame segments and wires within the resin package;
   wherein the first terminal includes an electrode portion projecting outwardly from the first side surface of the resin package;
   wherein the second terminal includes a first electrode portion projecting outwardly from the second side surface of the resin package, and a second electrode projecting outwardly from the third side surface of the resin package;
   wherein the third terminal includes an electrode portion projecting outwardly from the third side surface of the resin package;
   wherein the electronic components together with the metal frame segments constitute a protective circuit for protecting a rechargeable battery; and
   wherein the metal frame segments further include at least one intermediary element separate from the chip supporting segments and the terminals for electrically connecting at least one of the electronic components to at least another of the electronic components.

2. The multi-chip module according to claim 1, wherein the intermediary element is electrically connected to selected ones of the electronic components via wires.

3. The multi-chip module according to claim 1, wherein at least two of the electronic components are bonded on a common one of the chip supporting segments.

4. The multi-chip module according to claim 1, wherein at least one of the electronic components bridges between one of the terminals and one of the chip supporting segments.

5. The multi-chip module according to claim 1, wherein at least one of the electronic components bridges between selected two of the chip supporting segments.

\* \* \* \* \*